(12) United States Patent
Killinger

(10) Patent No.: US 7,751,716 B2
(45) Date of Patent: Jul. 6, 2010

(54) OPEN-PATH/FREE-SPACE OPTICAL COMMUNICATION SYSTEM AND METHOD USING REFLECTED OR BACKSCATTERED LIGHT

(75) Inventor: Dennis K. Killinger, Temple Terrace, FL (US)

(73) Assignee: University of South Florida, Tampa, FL (US)

( * ) Notice: Subject to any disclaimer, the term of this patent is extended or adjusted under 35 U.S.C. 154(b) by 1076 days.

(21) Appl. No.: 10/604,182

(22) Filed: Jun. 30, 2003

(65) Prior Publication Data

US 2004/0264972 A1 Dec. 30, 2004

Related U.S. Application Data

(63) Continuation of application No. PCT/US02/02866, filed on Jan. 30, 2002.

(60) Provisional application No. 60/265,022, filed on Jan. 30, 2001.

(51) Int. Cl.
*H04B 10/00* (2006.01)

(52) U.S. Cl. .................... 398/129; 398/128; 398/118; 398/40

(58) Field of Classification Search ......... 398/118–131, 398/182, 192; 356/3.02, 28.5
See application file for complete search history.

(56) References Cited

U.S. PATENT DOCUMENTS

| | | | | |
|---|---|---|---|---|
| 4,627,106 A * | 12/1986 | Drake | .......................... | 398/131 |
| 4,977,618 A * | 12/1990 | Allen | .......................... | 398/127 |
| 5,250,810 A * | 10/1993 | Geiger | .................... | 250/338.5 |
| 5,359,189 A * | 10/1994 | Savicki | ....................... | 250/216 |
| 5,696,859 A * | 12/1997 | Onaka et al. | .................. | 385/24 |
| 5,786,923 A * | 7/1998 | Doucet et al. | ................ | 398/122 |
| 5,796,471 A * | 8/1998 | Wilkerson et al. | .......... | 356/28.5 |
| 5,872,621 A * | 2/1999 | Wilkerson et al. | .......... | 356/28.5 |
| 5,903,373 A * | 5/1999 | Welch et al. | ................ | 398/128 |
| 5,986,787 A * | 11/1999 | Ohshima et al. | ............ | 398/127 |
| 6,034,760 A * | 3/2000 | Rees | .......................... | 356/28.5 |
| 6,064,502 A * | 5/2000 | Burns et al. | ................ | 398/129 |
| 6,317,237 B1 * | 11/2001 | Nakao et al. | ................ | 398/130 |
| 6,381,055 B1 * | 4/2002 | Javitt et al. | ................. | 398/131 |
| 6,664,529 B2 * | 12/2003 | Pack et al. | ............... | 250/208.1 |
| 6,760,110 B2 * | 7/2004 | Aoki et al. | ................. | 356/445 |
| 7,177,550 B1 * | 2/2007 | Smith | ......................... | 398/212 |

OTHER PUBLICATIONS

Richard D. Stoerger, The RC-40 Rapture Series IR Remote Control, Sep. 7, 2001, Audio Design Associates Inc.*
Lgardi, News group, Usenet, Topic in Comp.robotics, Apr. 8, 1993, "Radio Shack IR detector".*
Fritz R.Gfeller and URS Bapst, Proceedings Of the IEEE, Nov. 1979, vol. 67, No. 11, pp. 1417-1486.*
Lidar Tutorial from http://www.ghcc.msfc.nasa.gov/sparcle/ sparcle_tutorial.html.*

* cited by examiner

*Primary Examiner*—Agustin Bello
(74) *Attorney, Agent, or Firm*—Ronald E. Smith; Smith & Hopen, P.A.

(57) ABSTRACT

An open-path/free-space optical communication system using reflected light has modulated optical or laser sources and provides communication between the modulated source and a detector in an obstructed line-of-sight relationship. The system detects backscattered light impinging on a target illuminated by the source of light. Barrier objects positioned in a line-of-sight path between the source and detector are circumvented and a first device that provides the modulation signal for the source controls a remote second device.

17 Claims, 3 Drawing Sheets

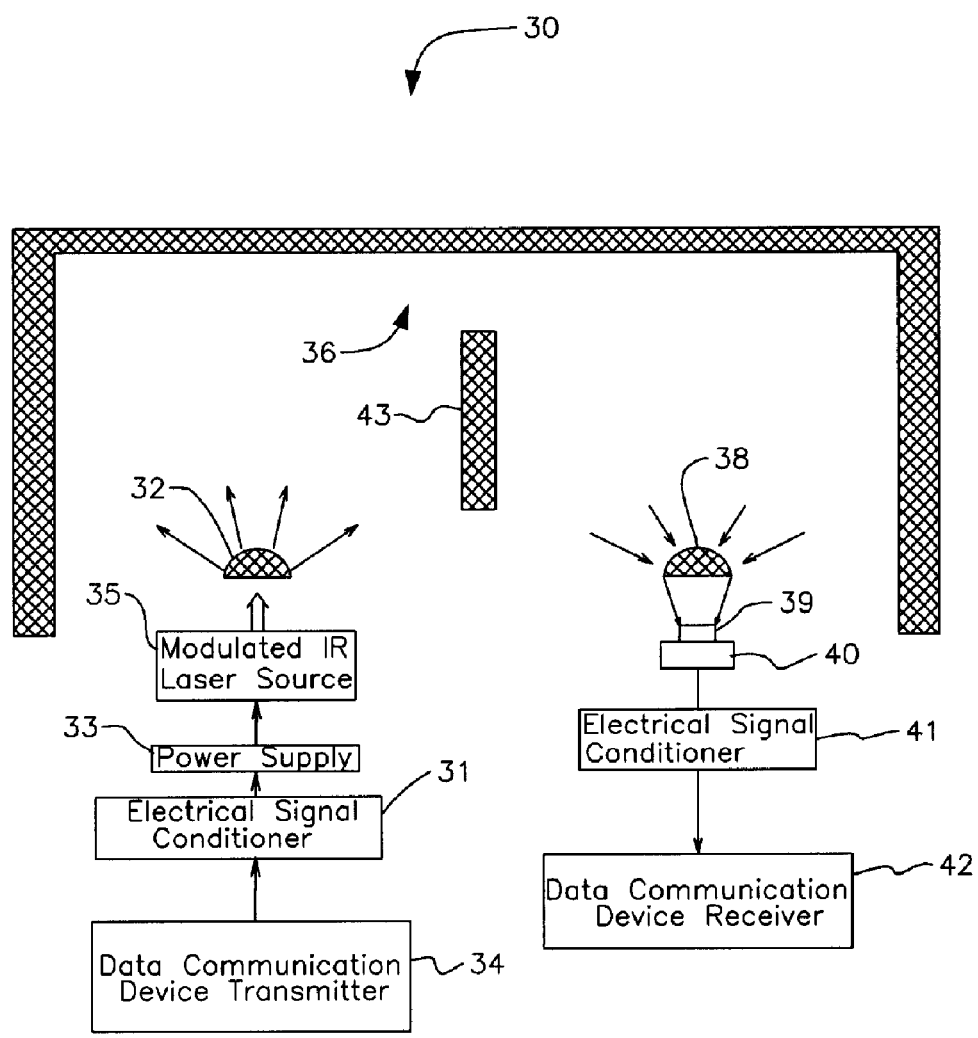

US 7,751,716 B2

OPEN-PATH/FREE-SPACE OPTICAL COMMUNICATION SYSTEM AND METHOD USING REFLECTED OR BACKSCATTERED LIGHT

RELATED APPLICATIONS

The present application is a continuation of prior filed International Application No. PCT/US02/02866, filed Jan. 30, 2002, which claims the benefit of U.S. Provisional Application No. 60/265,022, filed Jan 30, 2001.

BACKGROUND OF THE INVENTION

1. Field of the Invention

This invention relates to systems and methods for relaying information between two or more points by using laser or optically generated conductive transport means through the atmosphere to convey the information.

2. Description of the Prior Art

Open-path, or free space optics, is a line-of-sight technology that enables optical transmission of data, voice and video communications through the air, thereby providing optical connectivity without the need for expensive fiber-optic cable.

Free-Space optical systems can operate over a distance of several kilometers, provided the transmitting laser and the receiver are in a direct line-of-sight relationship. When a clear line of sight between the source and destination does not exist, optical communication between the devices has not been feasible because physical objects positioned in the line-of-sight path easily block direct line-of-sight communication. Thus, a cubical wall may separate two computers in a room from one another, for example, and prevent optical communication therebetween.

However, at the time of the present invention, it was not obvious to those of ordinary skill in the art how this fundamental problem could be overcome.

SUMMARY OF INVENTION

The long-standing but heretofore unfulfilled need for a communication device that enables data transfer between a data communication device transmitter and a data communication device receiver where a barrier means prevents line-of-sight communication therebetween is now met by a communication device for transmitting signals to a receiver that includes an optical light source adapted to generate light, a detector adapted to detect light, and an optical diffuse reflecting target in line-of-sight relation to the optical light source and in line-of-sight relation to the detector. A modulating device is connected in modulating relation to the optical light source and the detector is adapted to demodulate light reflected or backscattered by the target.

The light source is selected from the group consisting of a laser light source and a light-emitting diode.

In one embodiment, an enclosure having at least one wall member, or at least one ceiling member, or at least one floor member houses the optical light source, the detector, and the barrier. The at least one wall member, ceiling member, or floor member serves as the target.

In another embodiment, the communication device includes a first data communication device adapted to transmit data and a laser source modulated by the first data communication device. A transmitter telescope is adapted to aim modulated light from the laser source to the light-reflecting target. A second data communication device is adapted to receive data and a transducer in the form of an optical detector is adapted to generate electrical signals corresponding to detected optical signals is connected in driving relation to the second data communication device. A receiving telescope is adapted to collect modulated light reflected from the light-reflecting target and to deliver the modulated light to the optical detector. Moreover, an optical bandpass filter is electrically connected between the receiving telescope and the optical detector. A barrier means preventing line-of-sight communications between the first and second data communication devices is adapted to be positioned between the first and second data communication devices. The transmitter telescope causes modulated light to reflect from the light-reflecting target and the receiver telescope causes reflected light to focus on the optical detector. Accordingly, the second data communication device receives electrical signals from the first data communication device.

The light-reflecting target may be a ceiling, wall, or floor of a structure adapted to house the first and second data communication devices. The light-reflecting target may also be a natural structure such as a tree, or a man-made structure such as a building, external to a structure adapted to house the first and second data communication devices.

In another embodiment, the device again includes a first data communication device adapted to transmit data and a laser source modulated by the first data communication device. A first optical lens means having a $\pi$ to $2\pi$ steradians field of view is positioned in light dispersing relation to the laser source. A second data communication device is adapted to receive data and an optical detector adapted to generate electrical signals corresponding to detected optical signals is connected in driving relation to the second data communication device. A second optical lens means having a $\pi$ to $2\pi$ steradians field of view is positioned in light focusing relation to the optical detector. A barrier means preventing line-of-sight communication between the first and second data communication devices is adapted to be positioned in an enclosure between the first and second data communication devices.

Accordingly, the first optical lens means causes modulated light to reflect or backscatter in a diffuse manner from the ceiling, walls, or floor of the enclosure and the second optical lens means causes reflected light to focus on the optical detector. The second data communication device therefore receives electrical signals from the first data communication device.

The first optical lens means may take the form of a hemispherical short focus lens or it may be provided in the form of transmitter optics.

An electrical signal conditioning means is electrically connected between the first data communication device and the laser source.

The second optical lens means may take the form of a hemispherical short focus lens.

An electrical signal conditioning means may also be electrically connected between the optical detector and the second data communication device.

An optical bandpass filter may be connected between the second optical lens means and the optical detector.

Another embodiment includes a LIDAR communication system. More particularly, a laser is adapted to generate a LIDAR beam and a transmitting device is provided for modulating the laser. A transmit telescope is adapted to aim the LIDAR beam at a remote target and a receiver telescope is adapted to collect the LIDAR beam after the LIDAR beam has reflected or backscattered from the remote target. An optical detector means adapted to generate electrical signals upon receiving reflected light from the remote target is in light-receiving communication with the receiver telescope. A data-receiving device is adapted to receive electrical signals from the optical detector. In this way, the data-receiving device receives data from the data-transmitting device even when the data-receiving device is positioned in a location distant from the data-transmitting device even when at least one obstacle prevents line-of-sight communication between the data-transmitting device and the data receiving device.

An electrical signal conditioner adapted to condition signals from the data-transmitting device is preferably disposed in electrical communication between the data transmitting device and the laser. An electrical signal conditioner adapted to condition signals from the optical detector is also disposed in electrical communication between the optical detector and the data-receiving device.

It is an object of the invention to provide an open-path optical or laser beam communication system that conveys information between two or more points within a building structure even when one or more physical objects are positioned in a line-of-sight path between said points.

It is a further object of the invention to provide an open-path laser beam communication system that can convey information between two or more buildings even when one or more physical objects are positioned in a line-of-sight path between said buildings.

BRIEF DESCRIPTION OF DRAWINGS

FIG. 2 is a schematic showing the laser communication system inside a closed building;

DETAILED DESCRIPTION

Figure 1:
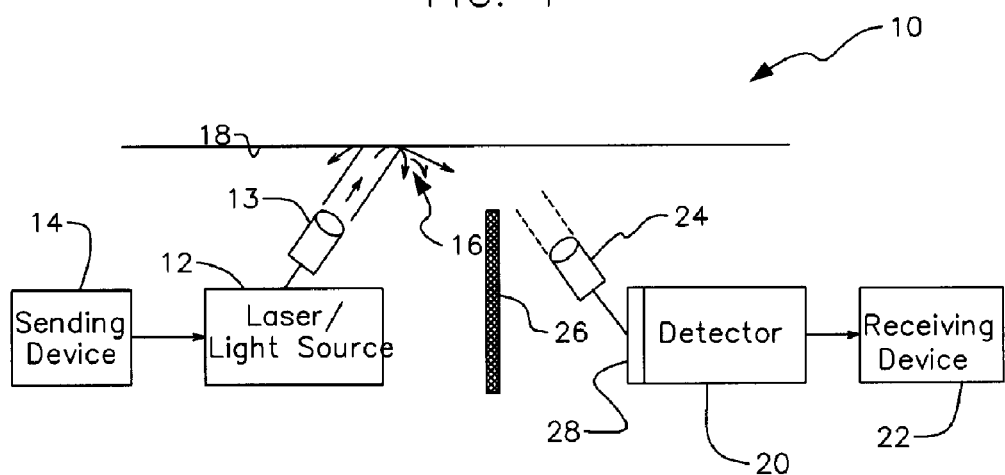
FIG. 1 is an overall schematic of the laser communication system of the present invention.
Figure 3:
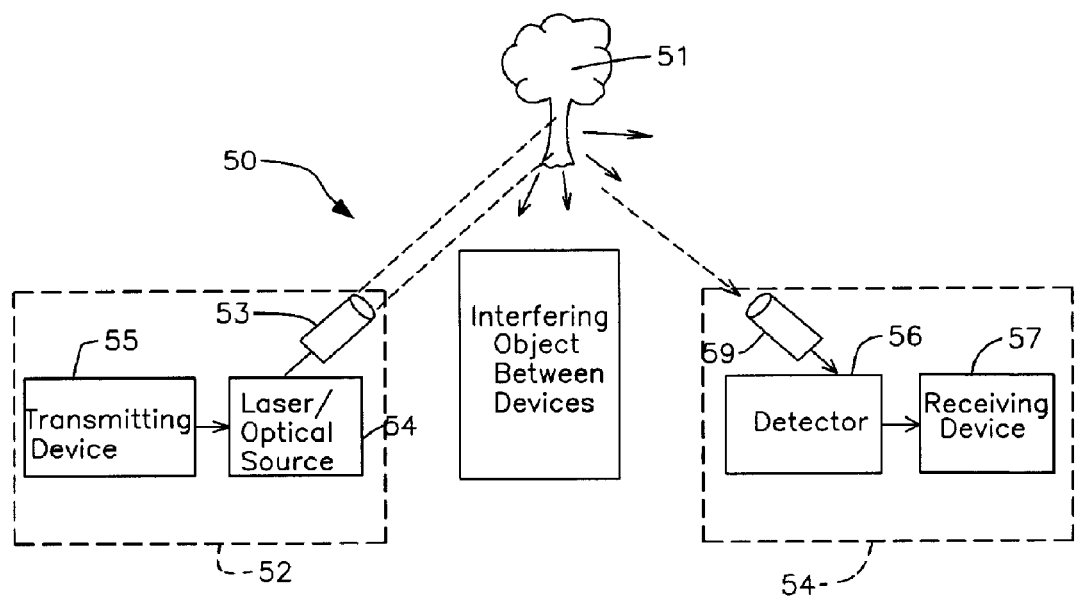
FIG. 3 is a schematic of a second embodiment of the invention showing the communication system communicating between buildings.

Referring now to FIG. 1, it will there be seen that an illustrative embodiment of the novel laser communication system is denoted as a whole by the reference numeral 10. It should first be observed in said FIG. 1 that a laser beam following a path of travel between the light source and the detector is constrained to follow a generally "V"-shaped path of travel because said laser light source and said detector are positioned out of line-of-sight relation to one another because there is a barrier between them. The same initial observation should be made in connection with FIGS. 2-4 as well.

System 10 includes laser generator or other light source 12 connected in communication modulation relation to sending device 14, i.e., sending device 14 modulates laser generator 12. Laser source 12 is adapted to generate light at multiple wavelengths simultaneously. Transmitter telescope 13 is adapted to aim a laser or other optical beam from laser generator 12 toward a target area 16 which in this embodiment may take the form of an area of a ceiling 18 or similar structure such as a wall, floor, or other suitable light-reflecting surface. The light is scattered from target area 16 and excites sensor 20 attuned to the wavelength or wavelengths emitted by laser generator 12. Sensor 20 is connected in driving relation to receiving device 22. Accordingly, system 10 enables communication of a control function whereby sending device 14 may control receiving device 22.

Although not illustrated, upon disclosure of the FIG. 1 embodiment, it becomes apparent that receiving device 22 could be similarly connected in driving relation to a second laser generator and sending device 14 could be similarly fitted with a second sensor so that device 22 could just as easily control device 14.

Sensor 20 is attuned to sense scattered light from a remote target area such as target area 16 by means of a highly sensitive device such as a receiver telescope means 24. Accordingly, a straight line-of-sight light path relationship between laser generator 12 and sensor 20 is not required. This enables operation of a remote device such as receiving device 22 when a straight-line relationship between source 12 and detector 20 is unavailable due to a physical barrier such as obstruction 26 in the straight-line light path.

Moreover, since the wavelength of a laser source is being detected, there is no need to bounce a wave away from target 16 to regenerate it at an intermediate station. Since the detector or sensor 20 can be a highly sensitive receptor device, there is no need for any amplification of the beam for the device to operate either at the source or at the intermediate target area. This enables use of a fairly low-power laser source, the sensitivity being a function of sensor 20 and not necessarily laser generator 12 or the presence of an unillustrated amplification device in target area 16 or anywhere else along the extent of the path of travel of the modulated beam.

In a practical application of this invention, any number of laser generators, sending and receiving devices, sensors, telescopes, and the like may be employed using different target areas or the same target area if the signals are encoded or different wavelengths and optically filtered detectors are used.

Laser generator 12 may be adapted to emit one of a plurality of wavelengths so that a specific signal will control a selective function at receiving device 22. Moreover, sensor 20 may be encoded to a certain wavelength to perform selective functions at various different locations. In this way, a variety of functions may be controlled at a single site because the sensors are enabled to select a certain wavelength to correspond to a specific response.

Optical bandpass filter 28 may also be used to pass preselected s and reject interfering light impinging on detector 20.

In the embodiment of FIG. 2, denoted 30 as a whole, a hemispherical or short focal length lens 32 scatters light to a plurality of points within a room. Lens 32 may be supplanted by transmitter optics. Data communication device transmitter 34 modulates infrared laser source 35 in much the same way as device 14 modulates laser 12 in the first embodiment. An LED or other suitable light source may also be used. Laser source 35 includes power supply 33. Various electrical components, including signal conditioners 31, provide an interface between transmitter 34 and laser source 35.

Light from lens 32 impinges upon surface or surfaces 36 and the reflected light is collected by hemispherical or short focal length lens 38. The focused light impinges upon optical bandpass filter 39 which filters out the various wavelengths of light illuminating the room and allows light within the passed bandwidth to impinge upon optical detector 40. Electrical signal conditioner 41 conditions the electrical signal generated by optical detector 40 and said signal is then received by data communication device receiver 42. Communication is thereby established between transmitter 34 and receiver 42 that is not subject to interference by physical barriers or obstacles such as obstacle 43 which may be in the room. Transmitter 34 and receiver 42 may be computers, each of which includes an RS-232 or Internet port for data.

This application is useful for any size room, including large spaces such as found in warehouse situations.

Because the light sensed by detector 40 is scattered as a result of impinging on target surface 36, the intensity of the beam emitted by laser source 35 is dictated by the sensitivity of the detector or sensor 40 and not on any requirements of an intermediate or relay system.

In practice, this system can be used to control functions of televisions, computers, telecommunication devices, Internet devices, printers, and the like. In a specific embodiment of this system, with the use of a $\pi$ or $2\pi$ steradian solid angle lens and detector, any problems caused by obstacle 43 may be overcome with ease. In addition to control functions, both analog and/or digital information may be conveyed in the light beam. This is accomplished by amplitude modulation of the power supply to the light source, such as an electro-optics modulator or a high electromechanical chopper to encrypt the information, In the embodiment of FIG. 3, laser communication system 50 is modified to communicate between buildings 52 and 54. In this embodiment, an external target, here shown as tree 51, is used between source 54, modulated by transmitting device 55, and detector apparatus 56 that delivers the data to receiving device 57. Transmitter and receiver telescopes 53 and 59 are used in the same manner as in the embodiment of FIG. 1. Other types of targets may be used, including, but not limited to, clouds, buildings, direct atmospheric aerosols, atmospheric molecules, etc. As in the first two embodiments, the same type of information may be transmitted, and the same sources used, but greater distances are covered. Multiple transmitters may be employed in this system, and optical as well as laser sources may supply the light beam, and there may also be a plurality of receiving devices using different target area or the same target area if the signals are encoded or different laser wavelengths and optically filtered detectors are used. Detection system 56 detects the scattered light emanating from target 51, irrespective of any intervening object in the direct optical pathway, which prevents point-to-point communication between source 54 and detector 56.

Figure 4:
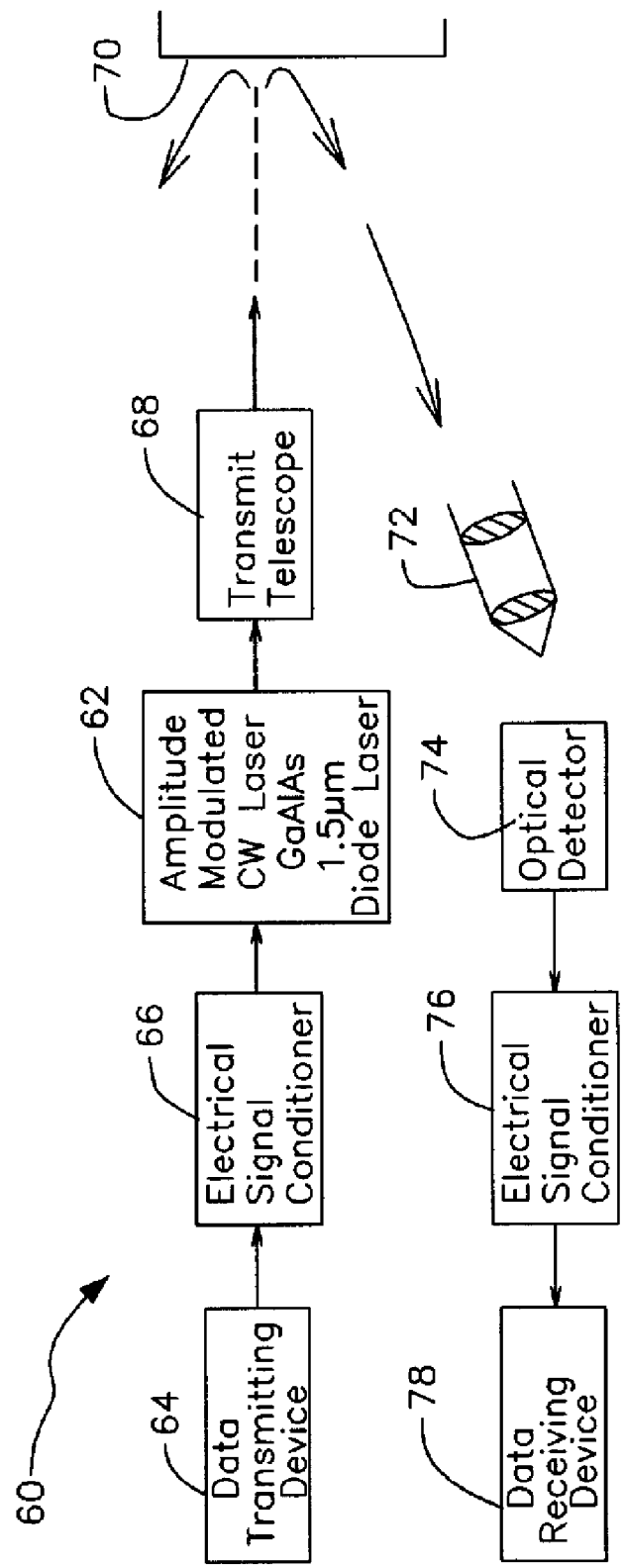
FIG. 4 is a schematic of an expanded version of the FIG. 3 system.

FIG. 4 depicts an expanded version of this system, denoted 60 as a whole, with an amplitude modulated continuous-wave GaAlAs 1.5 μm diode laser 62 as the source with encrypted electronic signals being carried by virtue of electronic modulation devices in the system. More specifically, electrical signal conditioners 66 condition signals from data transmitting device 64 and said conditioned signals modulate laser 62. The LIDAR beam generated by laser 62 is directed by transmit telescope 68 through the atmosphere to a distant target 70. The reflected beam is collected by receiver telescope 72 and delivered to optical detector 74. The electrical signals generated by optical detector 74 are conditioned by electrical signal detector 76 and delivered to data receiving device 78.

It will thus be seen that the objects set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

Now that the invention has been described,

The invention claimed is:

1. A communication device for transmitting signals to a receiver comprising:

at least one laser adapted to generate coherent light simultaneously at multiple wavelengths and different frequencies;

said receiver including at least one detector adapted to detect said coherent light at multiple wavelengths and different frequencies;

said at least one laser and said at least one detector being positioned in out of line-of-sight relation to one another;

said at least one laser positioned at a first fixed distinct position in a first enclosed structure such as a first building;

an opaque barrier positioned between said at least one laser and said at least one detector, said opaque barrier causing said at least one laser and said at least one detector to be in said out of line-of-sight relation to one another;

a plurality of external remote laser targets and target spatial regions fixed in line-of-sight relation to said at least one laser and in line-of-sight relation to said at least one detector;

said plurality of external remote laser targets and target spatial regions being disposed at a second fixed position remote from said first fixed position, said second fixed position being a second distinct position separated from said first distinct position by a large distance;

said external remote laser targets and laser target spatial regions including trees, buildings, clouds, atmospheric aerosols, ambient atmosphere including atmospheric gases, and like objects that are out-of-doors relative to said at least one laser and relative to said at least one detector;

a modulating device connected in modulating relation to said at least one laser, said modulating device disposed at said first fixed distinct position;

said modulating device adapted to modulate each of said multiple wavelengths so that multiple messages are transmitted simultaneously;

said communication device adapted to aim said modulated light from said at least one laser at said plurality of external remote targets and target spatial regions to separate spatially different communication optical signals from one another;

said at least one detector adapted to demodulate light scattered by said target;

said at least one detector being disposed at a third fixed distinct position remote from said second fixed distinct position in said line-of-sight relation to said external remote targets and said target spatial regions;

said third fixed distinct position of said at least one detector being disposed a large distance from said first fixed distinct position of said at least one laser;

said at least one detector including an optical bandpass filter adapted to pass preselected wavelengths of light and reject wavelengths of light outside of said preselected wavelengths;

said optical bandpass filter being disposed at said third fixed distinct position;

whereby multiple messages are simultaneously transmitted along multiple wavelengths and different frequencies;

whereby said multiple messages are individually detected by said at least one detector and;

whereby at least one laser beam follows a generally "V"-shaped path of travel between said at least one laser and said at least one detector.

2. A communication device adapted to reflect signals from a light reflecting target, comprising:

a first data communication device adapted to transmit multiple sets of data through multiple wavelengths, there being as many wavelengths as there are sets of data;

said first data communication device being disposed in a first fixed distinct position in an enclosed structure such as a first building;

a laser source modulated by said first data communication device, said laser source disposed at said first fixed distinct position;

a transmitter telescope adapted to aim modulated light of said multiple wavelengths from said laser source to a plurality of light-reflecting multiple external remote targets, said transmitter telescope disposed at said first fixed distinct position;

said plurality of light-reflecting multiple external remote targets being disposed in a second fixed distinct position that is a large distance from said first fixed distinct position in line-of-sight relation to said first fixed distinct position;

said plurality of light-reflecting multiple external remote targets including trees, buildings, clouds, atmospheric aerosols, ambient atmosphere including atmospheric gases, and like objects that are out-of-doors relative to said first data communication device;

a second data communication device adapted to receive multiple sets of data carried by said multiple wavelengths;

said second data communications device being disposed in a third fixed distinct position in an enclosed structure such as a second building that is a large distance from said second fixed distinct position in line-of-sight relation to said second fixed distinct position;

an optical detector connected in driving relation to said second data communication device, said optical detector adapted to generate electrical signals corresponding to detected optical signals and said optical detector being positioned in said second building;

a receiving telescope, positioned in said second building, aimed at said plurality of light-reflecting external remote targets and adapted to collect modulated light reflected from said plurality of light-reflecting external remote targets at said multiple wavelengths and to deliver said modulated light to said optical detector;

an optical bandpass filter connected between said receiving telescope and said optical detector, said optical bandpass filter positioned in said second building;

an opaque barrier means adapted to be positioned between said first and second data communication devices, said barrier means preventing line-of-sight communication between said respective first and third fixed distinct positions of said first and second data communication devices, respectively;

said communication device being adapted to aim said modulated light from said laser at said plurality of external remote targets at said second fixed distinct position to separate spatially different communication optical signals from one another;

said transmitter telescope causing modulated light at multiple wavelengths to reflect from said plurality of light-reflecting external remote targets;

said receiver telescope causing reflected light at said multiple wavelengths to focus on said optical detector;

said second data communication device receiving electrical signals from said first data communication device;

said optical bandpass filter passing each of said multiple wavelengths to said optical detector so that multiple messages are sent simultaneously from said first data communications device to said second data communications device;

whereby at least one laser beam follows a "V"-shaped path of travel between said first and second data communication devices.

3. A communication device adapted to reflect signals from remote laser targets positioned in an environment external to the environment of the communication device, comprising:

a first data communication device adapted to transmit data;

said first data communication device disposed at a first fixed distinct position in an enclosure such as a first building;

said remote laser targets including trees, buildings, clouds, atmospheric aerosols, and like substantially stationary objects in said environment external to the environment of the communication device;

said remote targets disposed at a second fixed distinct position that is a large distance from said first fixed distinct position in line-of-sight relation to said first fixed distinct position;

a laser source modulated by said first data communication device, said laser source being positioned in said first building;

a transmitter telescope adapted to aim modulated light from said laser source to a remote laser target positioned in said environment external to the environment of said communication device, said transmitter telescope being positioned in said first building;

a second data communication device adapted to receive data;

said second data communication device disposed at a third fixed distinct position in an enclosed structure such as a second building remote from said first and second fixed distinct positions in line-of-sight relation to said second fixed distinct position;

said first and second data communication devices being positioned in out of line-of-sight relation to one another;

an optical detector connected in driving relation to said second data communication device, said optical detector adapted to generate electrical signals corresponding to detected optical signals, said optical detector being positioned in said second building;

a receiving telescope adapted to collect modulated light reflected from said remote laser target and to deliver said modulated light to said optical detector;

said receiving telescope disposed at said third fixed distinct position;

an opaque, signal-attenuating barrier means adapted to be positioned between said first and second data communication devices, said opaque signal-attenuating barrier means preventing line-of-sight communication between said first and second data communication devices;

said first data communication device being adapted to aim said modulated light from said laser at said remote laser targets to separate spatially different communication optical signals from one another;

said transmitter telescope causing modulated light to reflect from said remote laser targets;

said receiving telescope causing reflected light to focus on said optical detector;

said second data communication device receiving electrical signals from said first data communication device;

whereby at least one laser beam follows a "V"-shaped path of travel between said first and second data communication devices.

4. The communication device of claim 3, further comprising an optical bandpass filter connected between said receiving telescope and said optical detector.

5. A LIDAR communication system, comprising:
   a laser adapted to generate a LIDAR beam;
   a data transmitting device for modulating said laser;
   said data transmitting device disposed at a first fixed distinct position in an enclosed structure such as a first building;
   a transmit telescope disposed at said first fixed distinct position adapted to aim said LIDAR beam at a plurality of external remote laser targets and laser target spatial regions;
   said plurality of external remote laser targets and laser target spatial regions being disposed at a second fixed distinct position that is a large distance from said first fixed distinct position in line-of-sight relation to said first fixed distinct position;
   a receiver telescope adapted to collect said LIDAR beam after said LIDAR beam has reflected from said remote laser target;
   an optical detector means in communication with said receiver telescope, said optical detector means adapted to generate electrical signals upon receiving reflected light from said receiver telescope;
   a data receiving device adapted to receive electrical signals from said optical detector;
   said receiver telescope, said optical detector means, and said data receiving device being disposed at a third fixed distinct position remote from said second fixed distinct position in line of sight relation to said second fixed distinct position, said third fixed distinct position being in an enclosed structure such as a second building positioned external to said first building;
   said data transmitting device and said data receiving device being positioned in out of line-of-sight relation to one another;
   said LIDAR communication system being adapted to aim said modulated light from said LIDAR beam at said plurality of external remote laser targets and laser target spatial regions to separate spatially different communication optical signals from one another;
   said external remote laser targets and laser target spatial regions including trees, buildings, clouds, atmospheric aerosols, and like substantially stationary objects that are out-of-doors relative to said laser;
   said data receiving device receiving data from said data transmitting device even when said data receiving device is positioned in a location distant from said data transmitting device and when at least one opaque, signal-attenuating obstacle prevents line-of-sight communication between said data transmitting device and said data receiving device;
   whereby said LIDAR beam follows a generally "V"-shaped path of travel from said laser to said data receiving device.

6. The LIDAR communication system of claim 5, further comprising:
   an electrical signal conditioner disposed in electrical communication between said data transmitting device and said laser, said electrical signal conditioner adapted to condition signals from said data transmitting device.

7. The LIDAR communication system of claim 5, further comprising:
   an electrical signal conditioner disposed in electrical communication between said optical detector and said data receiving device, said electrical signal conditioner adapted to condition electrical signals from said optical detector.

8. The communication device of claim 5, further comprising an optical bandpass filter disposed between said receiver telescope and said optical detector at said third fixed distinct position.

9. The communication device of claim 3, further comprising multiple optical wavelengths for communication of different communication signals simultaneously when the same external remote laser target is used as a common target for multiple communication devices.

10. The communication device of claim 3, further comprising multiple optical wavelengths for communication of different communication signals simultaneously when the same external remote laser target is used as a common target for LIDAR communication devices.

11. The communication device of claim 5, further comprising multiple optical wavelengths for communication of different communication signals simultaneously when the same external remote laser target is used as a common target for multiple communication devices.

12. The communication device of claim 5, further comprising multiple optical wavelengths for communication of different communication signals simultaneously when the same external remote laser target is used as a common target for LIDAR communication devices.

13. The communication device of claim 3, further comprising an optical signal transmitted to a remote external laser target wherein the backscattered optical signal is detected simultaneously by multiple telescope receivers positioned at different locations.

14. The communication device of claim 3, further comprising a common optical signal transmitted to a remote external laser target wherein the backscattered optical signal is detected simultaneously by multiple telescope receivers positioned at different locations.

15. The communication device of claim 5, further comprising an optical signal transmitted to a remote external laser target wherein the backscattered optical signal is detected simultaneously by multiple telescope receivers positioned at different locations.

16. The communication device of claim 5, further comprising a common optical signal transmitted to a remote external laser target wherein the backscattered optical signal is detected simultaneously by multiple telescope receivers positioned at different locations.

17. The communication device of claim 1, further comprising:
   a plurality of external remote laser targets including atmospheric backscatter in non-line-of-sight relation to said detector;
   said detector adapted to detect multipath backscatter from said multiple backscatter spatial target regions.

* * * * *